US010615584B2

(12) United States Patent
Aspas Puertolas et al.

(10) Patent No.: US 10,615,584 B2
(45) Date of Patent: Apr. 7, 2020

(54) CONTROLLING A LIGHTNING PROTECTION SYSTEM

(71) Applicant: AIRBUS SAFRAN LAUNCHERS SAS, Paris (FR)

(72) Inventors: Jesus Aspas Puertolas, Paris (FR); François Nguyen, Houilles (FR)

(73) Assignee: ARIANEGROUP SAS, Paris (FR)

( * ) Notice: Subject to any disclaimer, the term of this patent is extended or adjusted under 35 U.S.C. 154(b) by 215 days.

(21) Appl. No.: 15/553,702

(22) PCT Filed: Feb. 25, 2016

(86) PCT No.: PCT/EP2016/054006
§ 371 (c)(1),
(2) Date: Aug. 25, 2017

(87) PCT Pub. No.: WO2016/135254
PCT Pub. Date: Sep. 1, 2016

(65) Prior Publication Data
US 2018/0048136 A1 Feb. 15, 2018

(30) Foreign Application Priority Data
Feb. 27, 2015 (FR) ...................... 15 51680

(51) Int. Cl.
*F03D 80/30* (2016.01)
*F03D 17/00* (2016.01)
(Continued)

(52) U.S. Cl.
CPC ........... *H02G 13/60* (2013.01); *F03D 7/0272* (2013.01); *F03D 13/30* (2016.05); *F03D 80/30* (2016.05);
(Continued)

(58) Field of Classification Search
CPC ......... H02G 13/60; F03D 13/30; F03D 80/30; F03D 7/0272; G01R 31/026
See application file for complete search history.

(56) References Cited

U.S. PATENT DOCUMENTS 9,422,914 B2 * 8/2016 Appleton .............. F03D 1/0675
9,441,614 B2 * 9/2016 Olesen .................... F03D 7/022
(Continued)

FOREIGN PATENT DOCUMENTS

EP 2 559 972 A1 2/2013
FR 2 979 761 A1 3/2013
(Continued)

OTHER PUBLICATIONS

Search Report issued in French Patent Application No. 1551680 dated Jan. 27, 2016.
(Continued)

*Primary Examiner* — Mohamed Charioui
(74) *Attorney, Agent, or Firm* — Pearne & Gordon LLP

(57) ABSTRACT

The invention relates to a method for controlling a lightning protection system comprising a descent path. The method is characterized in that it comprises steps for: sending (E1) a radiofrequency signal to one end of the descent path, measuring (E2) a reflection coefficient, predetermining (E2) resonance frequencies of the descent path; and, comparing (E3) the predetermined resonance frequencies with preset resonance frequencies.

11 Claims, 3 Drawing Sheets

(51) Int. Cl.
 *H02G 13/00* (2006.01)
 *H02G 3/00* (2006.01)
 *F03D 13/30* (2016.01)
 *F03D 7/02* (2006.01)
 *G01R 31/02* (2006.01)
 *F03D 1/06* (2006.01)

(52) U.S. Cl.
 CPC ............. *G01R 31/026* (2013.01); *H02G 3/00* (2013.01); *F03D 1/0675* (2013.01); *F03D 17/00* (2016.05); *Y02E 10/721* (2013.01)

(56) References Cited

U.S. PATENT DOCUMENTS

2013/0218498 A1 8/2013 Driot
2017/0214232 A1 7/2017 Aspas Puertolas
2017/0335828 A1* 11/2017 Muller .................. G01P 15/093

FOREIGN PATENT DOCUMENTS

WO 2004/111686 A1 12/2004
WO 2007/107158 A1 9/2007

OTHER PUBLICATIONS

International Preliminary Report on Patentability issued in Application No. PCT/EP2016/054006 dated May 23, 2017.
International Search Report issued in Application No. PCT/EP2016/054006 dated May 27, 2016.
Written Opinion issued in Application No. PCT/EP2016/054006 dated May 27, 2016.
Chuantong Want et al., "Open Circuit Resonant (SansEC) Sensor for Composite Damage Detection and Diagnosis in Aircraft Lightning Environments", American Institute of Aeronautics and Astronautics, Jun. 25, 2012.

* cited by examiner

CONTROLLING A LIGHTNING PROTECTION SYSTEM

TECHNICAL DOMAIN

This invention relates to the domain of structures exposed to lightning such as wind turbines and systems protecting such a structure against lightning.

The invention relates more specifically to a device and a method for testing such a system for protection against lightning.

STATE OF PRIOR ART

Wind turbine blades are made principally of a composite material, for example with a fibrous reinforcement made of glass fibre.

Protection of a blade of a wind turbine of this type against lightning is conventionally based on a system comprising metal lightning receptors flush with the external surface of the blade and distributed along the blade, being connected to an electrically conducting down cable located inside the blade and connected to the earth by connection means integrated into the hub of the wind turbine rotor.

Since lightning preferably strikes lightning receptors, the lightning current is conducted by the down cable as far as the earthing connection.

This type of architecture of a lightning protection system is usually satisfactory but it is relatively complex to test. Control of a lightning protection system generally consists of verifying the electrical continuity of the device so that the lightning current that strikes a receptor is effectively conducted to the earth without causing any damage, or causing minimum damage, to the structure of the wind turbine blade.

In order to test the integrity of a conventional lightning protection system, the operator needs to access receptors from the outside, for example using an aerial basket, to be able to connect the same testing instrument to the receptors and to the end of the down cable. This operation is complex to implement and is expensive.

Furthermore, the conventional method is based on a measurement of the resistance between two points on the closed network positioned at opposite ends of the blade. This method requires two access points to make the measurements.

PRESENTATION OF THE INVENTION

The invention aims to solve problems with prior art by providing a method for testing a lightning protection system comprising a down path, characterised in that it comprises the following steps:
transmitting a radiofrequency signal at one end of the down path,
measuring a reflection coefficient,
determining resonant frequencies of the down path,
comparing the determined resonant frequencies with predetermined resonant frequencies. The test can be made at the rotor hub, that is relatively easy to access by an operator.

Application of the invention only requires access to a single point on the down path.

Resonant frequencies depend on the lengths of the different sections of the down path. Their determination and comparison with predetermined resonant frequencies provides information about whether or not the down path has been damaged.

According to one preferred characteristic, the step of determining resonant frequencies of the down path includes determination of resonant frequencies as a function of local minimum values of the amplitude of the reflection coefficient as a function of the frequency.

According to another preferred characteristic, the step of determining resonant frequencies of the down path includes determination of resonant frequencies as a function of inflection points of the phase of the reflection coefficient as a function of the frequency.

According to yet another preferred characteristic, the step of determining resonant frequencies of the down path includes determination of resonant frequencies as a function of local maximum values of the derivative of the phase of the reflection coefficient as a function of the frequency.

Obviously, resonant frequencies can be determined according to several of these possibilities, to increase the reliability of the determination by comparing the results.

According to one preferred characteristic, the comparison step includes a comparison of resonant frequencies with resonant frequencies of the down path without any faults.

Thus, it can be determined whether or not there is any damage to the down path.

According to one preferred characteristic, the comparison step includes a comparison of resonant frequencies with the resonant frequencies of the down path containing predetermined breaks.

Thus, when the down path has been damaged, it is possible to determine the fault in the down path.

According to one preferred characteristic, the method of testing a lightning protection system is used in a vector network analyser.

According to one preferred characteristic, the method of testing a lightning protection system is used for a wind turbine lightning protection system.

The invention also relates to a device for testing a lightning protection system comprising a down path, characterised in that it comprises:
means of transmitting a radiofrequency signal at one end of the down path,
means of measuring a reflection coefficient,
means of determining resonant frequencies of the down path,
means of comparing the determined resonant frequencies with predetermined resonant frequencies.

The invention also relates to a wind turbine lightning protection system, characterised in that it comprises the testing device for a lightning protection system as described above. The protection device and system have advantages similar to those mentioned above.

The invention also relates to a computer program containing instructions for execution of the steps in the method as described above, when said program is executed by a computer.

The invention also relates to a recording medium that can be read by a computer in which a computer program is stored containing instructions for execution of the steps in the method described above.

BRIEF DESCRIPTION OF THE DRAWINGS

Other characteristics and advantages will become clear after reading the following description of a preferred embodiment given as a non-limitative example, described with reference to the figures in which.

DETAILED PRESENTATION OF PARTICULAR EMBODIMENTS

Figure 1:
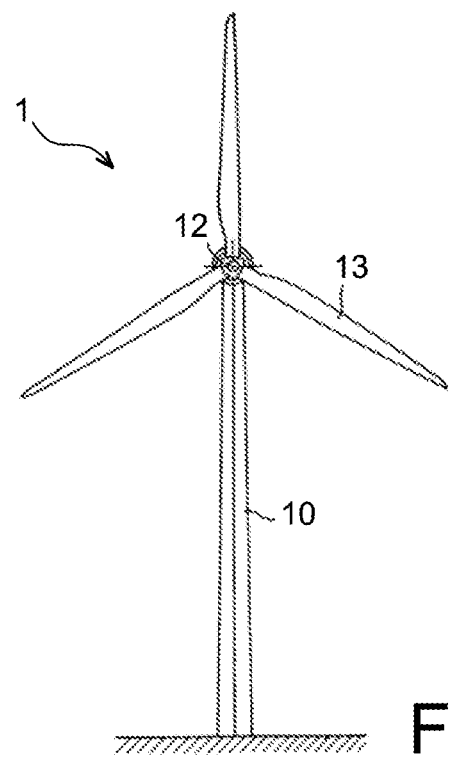
FIG. 1 represents a wind turbine.

According to one embodiment shown on FIG. 1, a wind turbine 1 generally comprises a tower 10 fixed to the ground, a nacelle supported by the tower and housing a rotor hub 12 supporting blades 13 and mounted free to rotate about a rotor axis. Each blade 13 comprises a base connected to the rotor hub 12, and prolonging with a slender aerodynamic profile to an end, in a well-known manner.

The mechanical structure of the wind turbine is conventional, but its lightning protection system is described below.

Figure 2:
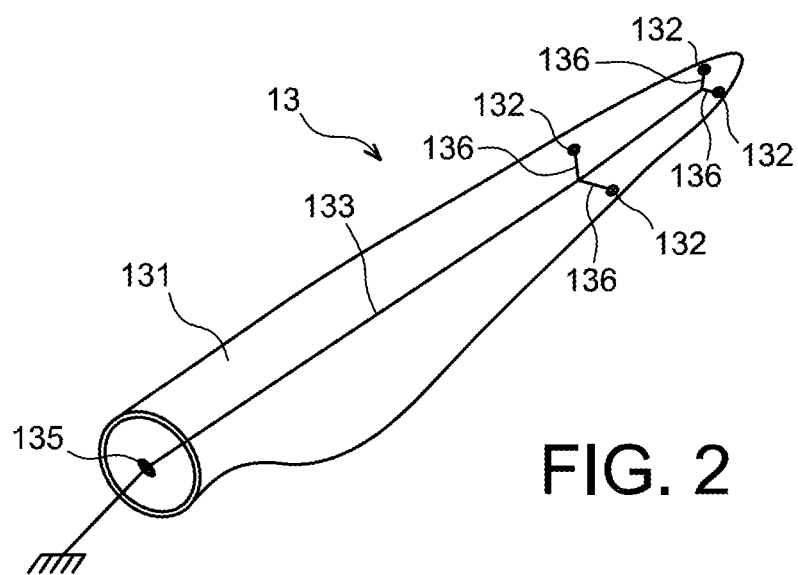
FIG. 2 represents a wind turbine blade equipped with a lightning protection system.

FIG. 2 diagrammatically illustrates a blade 13 of the wind turbine 1. The blade 13 is globally in the form of one or several spars not shown, and an aerodynamic outer skin 131 fixed to the spar. These elements are conventional and will not be described herein.

The blade 13 comprises a lightning protection system.

This system comprises at least one lightning receptor 132. This is a metallic element flush with the external surface, close to the end of the blade. Preferably, the lightning protection system comprises a plurality of lightning receptors 132, distributed on the outer surface of the blade. In the example shown on FIG. 2, the blade comprises two end receptors positioned symmetrically in a plane transverse to a plane of symmetry of the blade, and two median receptors, also positioned symmetrically in the same transverse plane. Obviously, the number and the arrangement of the receptors can be different.

The receptors 132 are connected to one or several lightning down cables 133, through cables 136. This electrical conductors system forms a tree structure containing different trunk and branch sections. This structure thus forms a down path that extends between the receptor(s) located close to the end of the blade and the hub 12 at which the down path includes an earthed terminal 135.

The following description is particularly concerned with this down path.

Figure 3A:
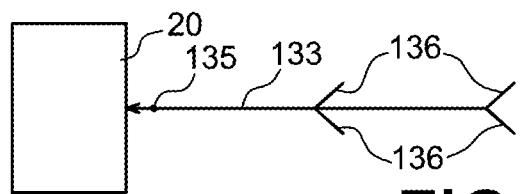
FIG. 3a represents an electrical circuit equivalent to the lightning protection system, in the test configuration, according to one embodiment of this invention.

FIG. 3a represents the electrical circuit equivalent to the lightning protection system, in the test configuration, according to one embodiment of this invention.

The purpose of the test is to measure the continuity of the electrical circuit of the lightning protection system.

To achieve this, the connection terminal 135 of the down path is disconnected from the earth and is connected to a test device that injects a radio frequency electrical signal into the down path, and then the reflected electrical signal is measured. The test device preferably comprises a vector network analyser 20. This operation is done at the hub of the rotor. In another embodiment, the vector network analyser 20 is connected to any lightning receptor 132. In this case there is no need to disconnect the earthing terminal 135.

The vector network analyser 20 is used to make a radio frequency measurement at a single port.

The principle of the measurement is based on reflectometry in the frequency domain.

Figure 3B:
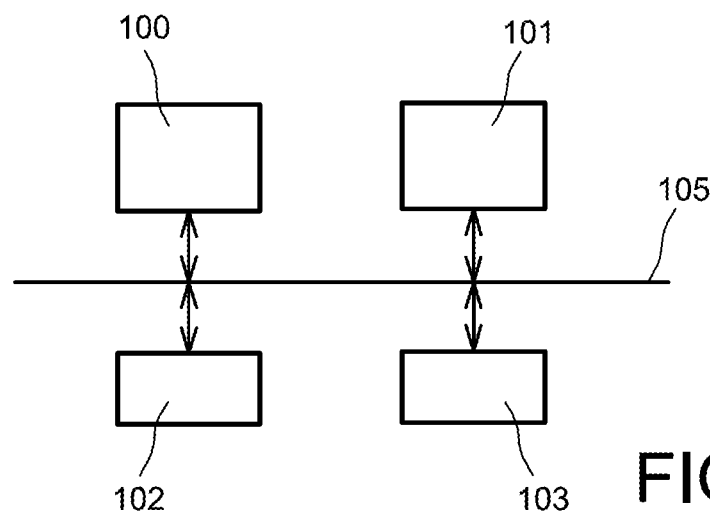
FIG. 3b represents an embodiment of the test device, according to one embodiment of this invention.

FIG. 3b represents a particular embodiment of the test device, according to this invention.

The general structure of the test device is that of a computer. In particular, it comprises a processor 100 running a computer program implementing the method according to the invention that will be described below, a memory 101, an input interface 102 and an output interface 103.

These different elements are connected conventionally through a bus 105.

The input interface 102 is connected to the connection terminal 135 of the down path. The interface 102 produces data representing the measurements made.

The processor 100 performs the processing described below. This processing is done in the form of code instructions of the computer program that are stored in the memory 101 before being executed by the processor 100.

The output interface 103 is a human-machine interface 104 that provides information to an operator about the down path that has been tested.

Figure 4:
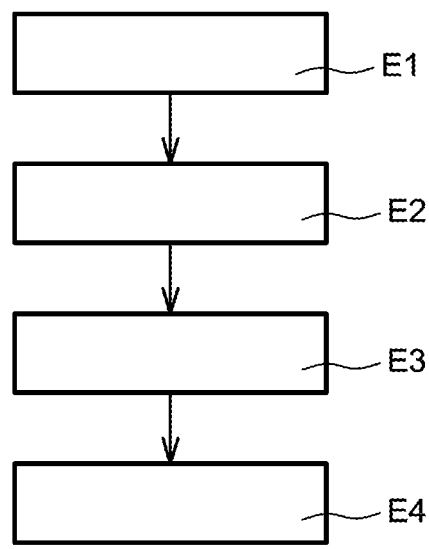
FIG. 4 represents a test of the lightning protection system, according to one embodiment of this invention.

FIG. 4 represents the method of testing the lightning protection system, according to one embodiment of this invention. The method comprises steps E1 to E4 making use of the vector network analyser 20.

Step E1 transmits a sinusoidal radiofrequency signal at one end of the down path. The amplitude and the phase of the transmitted signal are predetermined. The frequency of the transmitted signal varies between two boundaries.

The next step E2 measures the amplitude of the phase of the reflected signal on the same port, in order to determine resonant frequencies of the down path.

In particular, the reflection coefficient at the input, called the $S_{11}$ parameter, is measured with the vector network analyser 20. The $S_{11}$ parameter is the ratio between the amplitudes and phases of the transmitted and reflected signals. When the frequency of the transmitted signal varies, a frequency scan of the $S_{11}$ parameter is obtained.

This frequency scan of the $S_{11}$ parameter is used to determine the resonant frequencies of the down path that depend on the lengths of the different sections of the branches 136 and the trunk 133 of the down path.

Figure 5A:
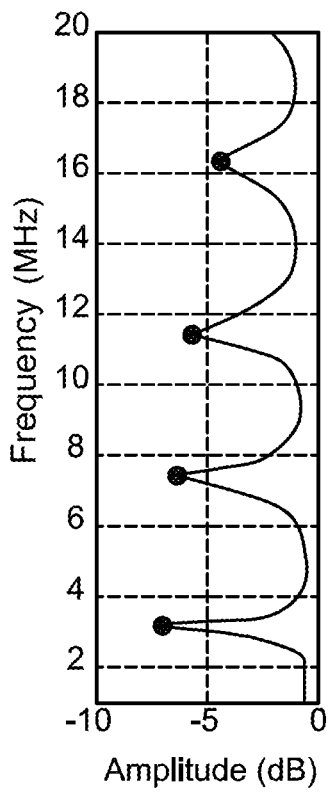
FIGS. 5a to 5c represent the amplitude, the phase and the derivative of the phase of a reflection coefficient as a function of the frequency, according to one embodiment of this invention.
Figure 5B:
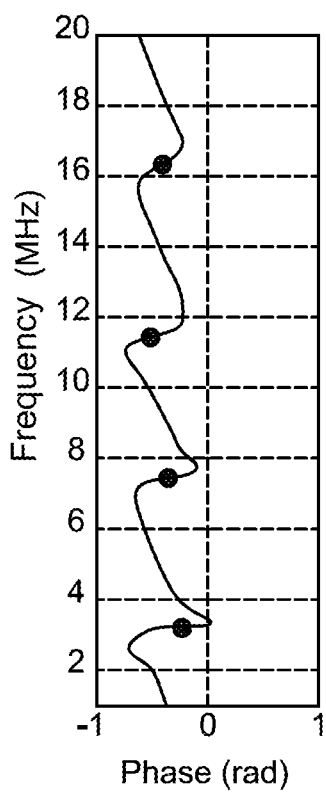
Figure 5C:
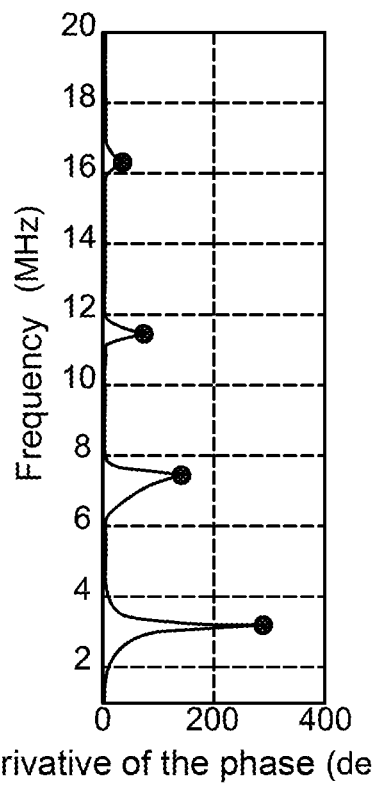

The different variants in the determination of resonant frequencies are illustrated on FIGS. 5a to 5c.

FIG. 5a represents the amplitude of the reflection coefficient as a function of the frequency. The resonant frequencies can be determined as a function of local minima of this amplitude.

FIG. 5b represents the phase of the reflection coefficient as a function of the frequency. Resonant frequencies correspond to inflection points on the phase curve.

FIG. 5c represents the derivative of the phase of the reflection coefficient as a function of the frequency. Resonant frequencies correspond to local maxima of this curve.

The example shown includes four resonant frequencies.

Working on the derivative of the phase mitigates the problem of a possible slow drift in the offset and a potential calibration fault of the instrument.

Resonant frequencies depend on the lengths of the different sections of the down path.

The next step E3 compares the previously detected resonant frequencies with predetermined resonant frequencies. These predetermined resonant frequencies are preferably composed of several sets. Firstly, they include resonant frequencies of the down path without any faults. This is the signature of the down path. Sets of frequencies corresponding to predetermined breaks in the down path can then also be created. These can be used to identify faults in the down path.

It is thus possible to determine if the integrity of the down path has been maintained, and if not, to qualify the detected fault.

The next step E4 is to produce a message indicating the result of the previous comparison step. For example, if the determined resonant frequencies correspond to the fault-free down path, then no degradation has occurred in the down path.

Otherwise, the down path is degraded and if the determined resonant frequencies correspond to resonant frequencies associated with a predefined degradation, then the degradation of the down path corresponds to this predefined degradation.

The test is thus made easily and economically. An operator accesses the down path connection terminal, at the hub of the rotor 12.

The invention has been described for a wind turbine blade, but it can be transposed to other applications. For example, the test according to the invention can be applied to a lightning protection system in a building.

What is claimed is:

1. A method for testing a lightning protection system comprising a down path with a tree structure comprising the following steps:
    transmitting a radiofrequency signal at one end of the down path,
    measuring a reflection coefficient,
    determining resonant frequencies of the down path based on the transmitted radiofrequency signal and the measured reflection coefficient, and
    comparing the determined resonant frequencies with predetermined resonant frequencies.

2. The method for testing a lightning protection system according to claim 1, wherein the step of determining resonant frequencies of the down path includes determination of resonant frequencies as a function of local minimum values of the amplitude of the reflection coefficient as a function of the frequency.

3. The method for testing a lightning protection system according to claim 1, wherein the step of determining resonant frequencies of the down path includes determination of resonant frequencies as a function of inflection points of the phase of the reflection coefficient as a function of the frequency.

4. The method for testing a lightning protection system according to claim 1, wherein the step of determining resonant frequencies of the down path includes determination of resonant frequencies as a function of local maximum values of the derivative of the phase of the reflection coefficient as a function of the frequency.

5. The method for testing a lightning protection system according to claim 1, wherein the comparison step includes a comparison of resonant frequencies with resonant frequencies of the down path without any faults.

6. The method for testing a lightning protection system according to claim 1, wherein the comparison step includes a comparison of resonant frequencies with resonant frequencies of the down path containing predetermined breaks.

7. The method for testing a lightning protection system according to claim 1, used in a vector network analyzer.

8. The method for testing a lightning protection system according to claim 1, used for a wind turbine lightning protection system.

9. A non-transitory computer readable medium containing instructions for execution of the steps in the method according to claim 1 when executed by a computer.

10. A device for testing a lightning protection system comprising a down path with a tree structure, the device including:
    at least one computer having a processor and memory configured to:
        transmit a radiofrequency signal at one end of the down path,
        measure a reflection coefficient,
        determine resonant frequencies of the down path based on the transmitted radiofrequency signal and the measured reflection coefficient, and
        compare the determined resonant frequencies with predetermined resonant frequencies.

11. A wind turbine lightning protection system, comprising the testing device for a lightning protection system according to claim 10.

* * * * *

UNITED STATES PATENT AND TRADEMARK OFFICE
CERTIFICATE OF CORRECTION

PATENT NO.         : 10,615,584 B2
APPLICATION NO.    : 15/553702
DATED              : April 7, 2020
INVENTOR(S)        : Jesus Aspas Puertolas Page 1 of 1

It is certified that error appears in the above-identified patent and that said Letters Patent is hereby corrected as shown below:

On the Title Page

"(71) Applicant: AIRBUS SAFRAN LAUNCHERS SAS" should read -- (71) Applicant: ARIANEGROUP SAS --

Signed and Sealed this
Twenty-fifth Day of April, 2023

Katherine Kelly Vidal
*Director of the United States Patent and Trademark Office*